United States Patent
Hemmenway et al.

(10) Patent No.: US 6,351,021 B1
(45) Date of Patent: Feb. 26, 2002

(54) LOW TEMPERATURE COEFFICIENT RESISTOR (TCRL)

(75) Inventors: Donald F. Hemmenway, Melbourne; Jose Delgado, Valkaria; John Butler; Anthony Rivoli, both of Palm Bay, all of FL (US)

(73) Assignee: Intersil Americas Inc., Irvine, CA (US)

( * ) Notice: Subject to any disclaimer, the term of this patent is extended or adjusted under 35 U.S.C. 154(b) by 0 days.

(21) Appl. No.: 09/345,929

(22) Filed: Jul. 1, 1999

(51) Int. Cl.[7] .............................................. H01L 29/00
(52) U.S. Cl. ...................... 257/538; 257/359; 257/380
(58) Field of Search ................................ 257/538, 380, 257/363, 379, 359, 358

(56) References Cited

U.S. PATENT DOCUMENTS

| | | | | |
|---|---|---|---|---|
| 5,422,298 A | * | 6/1995 | Jimenez | 437/60 |
| 5,489,547 A | * | 2/1996 | Erdeljac et al. | 437/60 |
| 5,807,780 A | | 9/1998 | Davis et al. | |

* cited by examiner

*Primary Examiner*—Olik Chaudhuri
*Assistant Examiner*—Ginette Peralta
(74) *Attorney, Agent, or Firm*—Jaeckle Fleischmann & Mugel, LLP (57) ABSTRACT

A low temperature coefficient resistor (TCRL) has some unrepaired ion implant damage. The damaged portion raises the resistance and renders the resistor less sensitive to operating temperature fluctuations.

2 Claims, 11 Drawing Sheets

SCATTER PLOT OF TCR vs Rs

FIG. 21

*FIG. 22* *RESISTANCE CHANGES WITH TEMPERATURE*

TCR(-50C~+25C)=-59.63 ppm; TCR(25C~125C)=71.68 ppm

*FIG. 23* *TCR CHANGES OVER TEMPERATURE*

FIG. 24 *MISMATCH AS A FUNCTION OF LENGTH*

FIG. 25 *MISMATCH AS A FUNCTION OF WIDTH*

LOW TEMPERATURE COEFFICIENT RESISTOR (TCRL)

BACKGROUND OF THE INVENTION

Advanced wireless communications products demand integrated circuit technologies with high performance, high levels of system integration, low power and low cost. For wireless applications up to several GHz silicon bicmos technology is uniquely suited to meet these requirements. Of critical important to RF design is the availability of high quality passive components. In particular, it is desirable to have implanted thin film resistors that have a low temperature coefficient of resistance (TCRL). Unfortunately, existing techniques for polysilicon thin film resistors generally result in thin film resistors with relatively large temperature coefficients of resistance. We have discovered a process and a low temperature coefficient resistor that overcomes the problem of the prior art.

SUMMARY

We have discovered a polysilicon thin film low temperature coefficient resistor and a method for making the same. The TCRL is formed on a layer of insulation, typically silicon dioxide or silicon nitride. The layer comprises polysilicon that has a relatively high dopant concentration and has a substantial amount of unannealed implant damage. The polysilicon is implanted with one or more species. However, contrary to prior art methods, the implanted resistor is annealed less than typical prior art implanted resistors in order to leave some unannealed damage in the resistor. This gives the TCRL a higher resistance without increasing its temperature coefficient. Thus, even though the temperature may increase, the relative value of the resistance remains the same. As such, the resistor is more precise and may be used in connection with the precision requirements for high quality RF devices.

DETAILED DESCRIPTION OF THE DRAWINGS

A P-type substrate has its upper surface covered with a suitable ion implantation mask such as deposited oxide, thermally-grown oxide or photoresist. Openings are made in the resist mask to define the N+ buried layer regions 12.1 and 12.2. Those regions are implanted with N-type implants such as implantation mask is then stripped, the N+ buried layer is driven in with a suitable annealing operation and an N-type epitaxial layer 11 is grown on top of the substrate 10. As a result, the substrate 10 is patterned into CMOS regions 100 that are separated from bipolar NPN regions 200 by a transition regions 150. The N-type buried layers are formed beneath regions that will receive P-type wells. No buried layer is required for the N-type wells.

Figure 1:
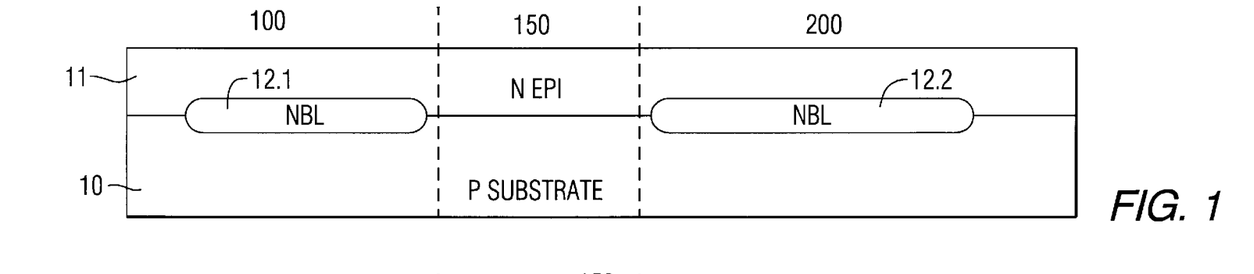
FIGS. 1–19 show sequential process steps in the formation of A TCRL in a bicmos process.
Figure 2:
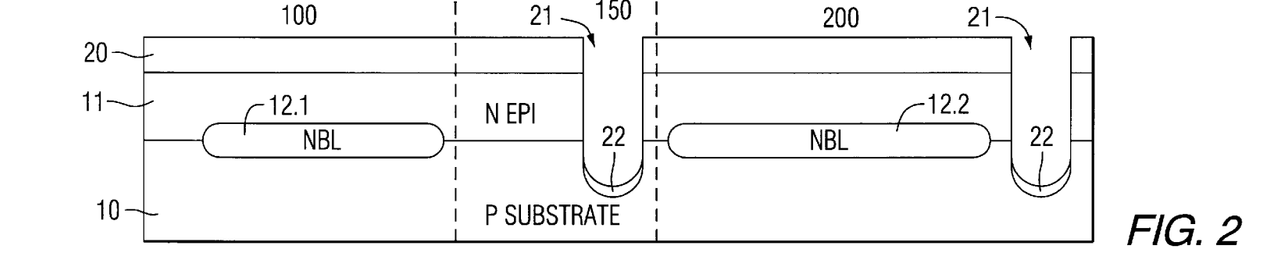
Figure 3:
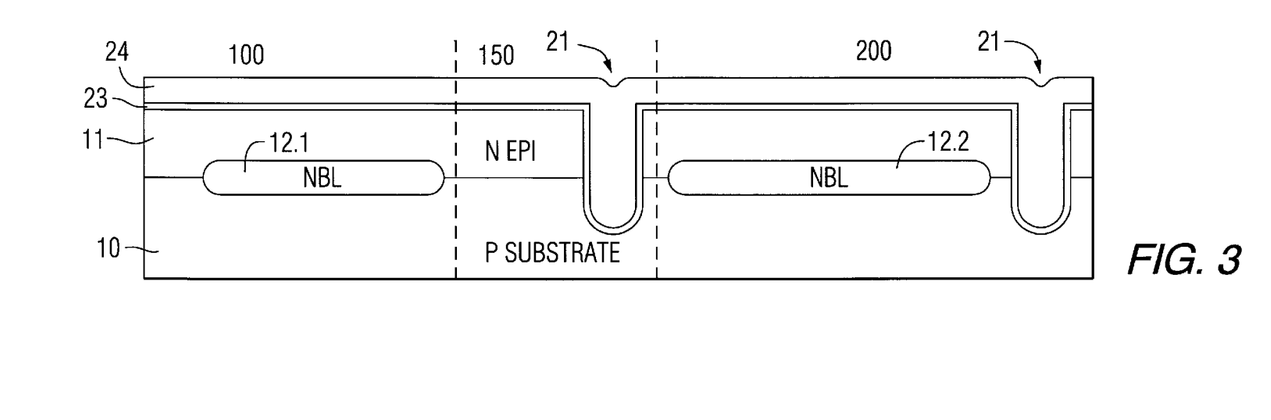
Figure 4:
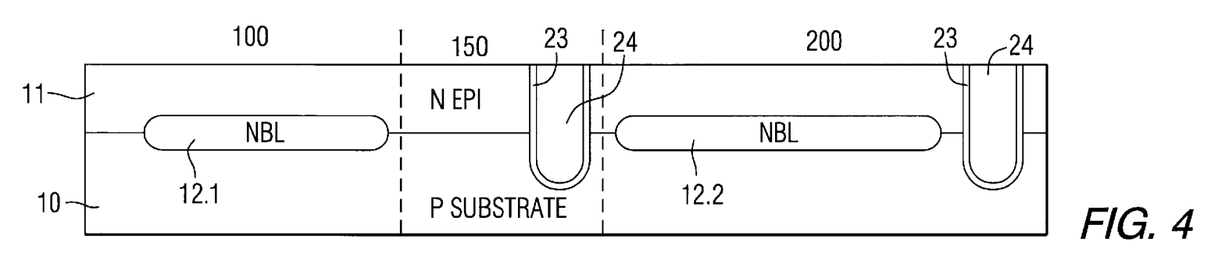

Isolation trenches are formed in transition region 150. The initial trench formation step is shown in FIG. 2. A trench photoresist mask 20 is uniformly deposited and patterned on the substrate 10. The photoresist is developed to expose the trench regions 21. A suitable wet or dry etch operation etches the trenches 21 down to a level below the N+ buried layers 12.1 and 12.2. The bottoms of the trenches are then implanted with a suitable P+ channel stop 22. As shown in FIG. 3, the next step includes stripping the photoresist 20 and depositing and patterning a sidewall oxidation layer 23. The oxidation layer 23 is densified and then the substrate 10 is subjected to a polysilicon deposition step that deposits a polysilicon layer over the substrate 20 and fills the trenches 22. FIG. 4 shows completion of the trenches. The substrate 10 is planarized to remove the layers of polysilicon 22 and the thermal oxide 23 from the surface of the substrate 10 in all areas except above the trenches. Such planarization is accomplished with a conventional chemical mechanical polishing operation.

Figure 5:
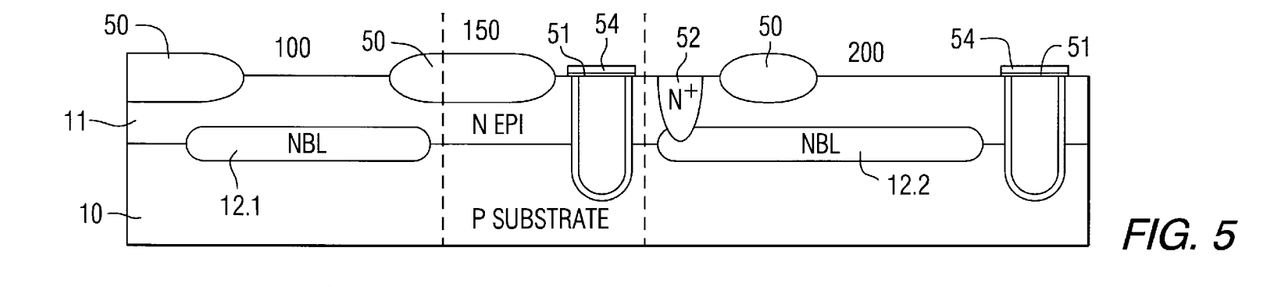

It is important to protect both the trenches and to cover the NPN region 200 during formation of the CMOS devices. Likewise, it is a goal of this process to combine as many of the CMOS and bipolar processing steps as possible. Accordingly, turning to FIG. 5, the trenches are initially protected from the subsequent CMOS processing steps. This protection includes forming a pad oxide layer 51 over the trenches. Pad oxide layer 51 is followed by an N+ sinker photoresist deposition, patterning and implantation step to form the N+ sinker 52 for the future collector of the NPN transistors 200. Next, a layer of silicon nitride 54 is deposited over the pad oxide 51 on the surface of the substrate 10. The silicon nitride is initially patterned to expose local oxidation (LOCOS) regions 50. Following LOCOS patterning, a conventional LOCOS operation fabricates LOCOS regions 50 that provide surface lateral isolation of the NMOS and PMOS devices 100 and separates the sinker diffusion 50 from the rest of the NPN transistor 200. The silicon nitride is stripped from the rest of the surface of the substrate 10 except for regions above the trenches 22. The pad oxide is then removed from the surface of substrate 10 and epitaxial region 11 to expose the surface for further fabrication.

Figure 6:
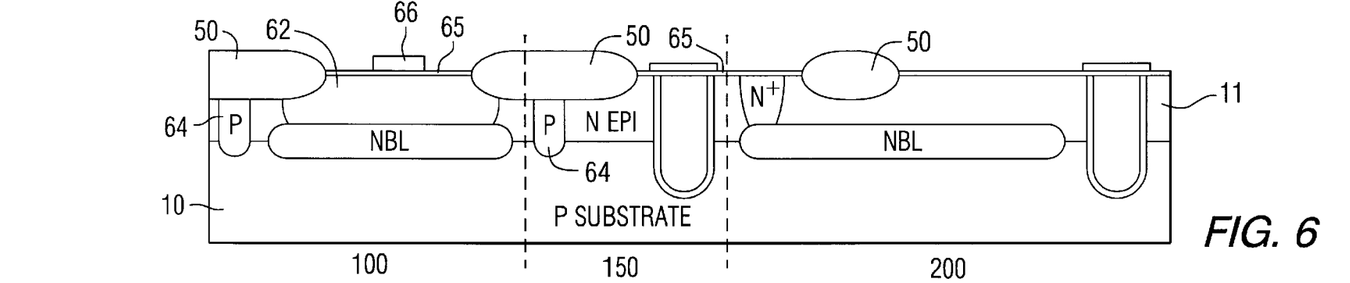

In the next step, as shown in FIG. 6, a sacrificial oxidation is performed on the surface of epitaxial layer 11. The oxidation is a typical first step in the formation of N-wells and P-wells for the CMOS devices 100. Suitable photoresist masks and implants 62, 63 provide the N-wells and P-wells for the CMOS devices. A heavier P-type implant provides junction isolation to separate PMOS and NMOS devices. A gate oxide layer 65, typically a thermal oxide grown on the surface of epitaxial layer 11. That step is followed by uniform deposition of a layer of polysilicon 66 which is subsequently patterned and doped to form polysilicon gates 66 as shown in FIG. 6.

Figure 7:
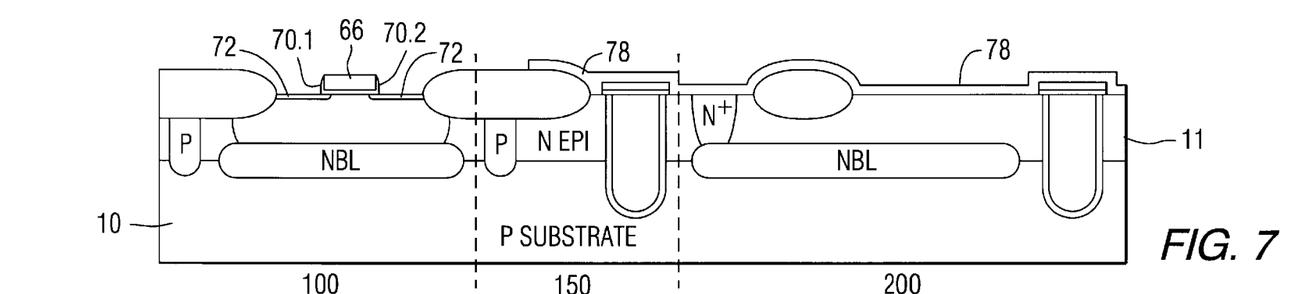

The next step in the fabrication of the CMOS transistors is shown in FIG. 7. An NPN protection spacer oxide layer 78 is uniformly deposited over epitaxial layer 11. The spacer oxide 78 covers the transition region 150 and NPN region 200 of layer 11. Otherwise, subsequent CMOS processing steps would interfere with the formation of the NPN transistor. The spacer oxide layer 78 not only provides the sidewall spacers for the CMOS devices but also provides a hard mask and surface isolation for the active elements of the NPN transistor. Performing this deposition step early in the process saves one or more deposition and masking steps later in the process. As a result, the spacer oxide layer 78 forms the mask for the self aligned sources and drains of the CMOS devices and the mask for the collector and emitter openings 126, 127, respectively. See FIG. 12. The spacer oxide layer over the gate 66 is patterned and removed to leave sidewall spacers 70.1, 70.2 the edges of the gate 66.

Next, the NMOS and PMOS drains receive a typical lightly-doped drain implant 72(N) and 74(P) for forming the N-type lightly-doped drain regions and the P-type lightly-doped drain regions. An annealing step drives the lightly doped drains slightly under the sidewall of the gates. The lightly doped drain regions use the sidewalls of the gate as masks. These regions are self-aligned in a conventional manner using the gate as masks followed by suitable P-type and N-type implants. Following that step, in a region not shown in the figure, a typical P+ resistor is formed in the N-type epitaxial region 11 using a suitable photoresist and implant.

Figure 8:
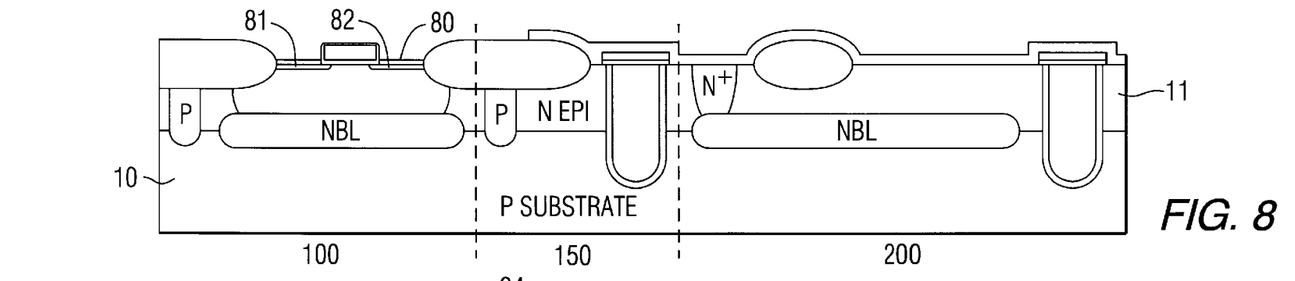

The next CMOS processing step is shown in FIG. 8. A screen oxide layer 82 is deposited and patterned to cover the lightly doped source and drain regions of the CMOS device. Those regions are then suitably implanted with either a P+ or N+ ions to form the sources and drains. The respective P-type and N-type sources and drains are then subjected to an annealing operation where the diffusion time is set to adjust the depth of the sources and drains.

Figure 9:
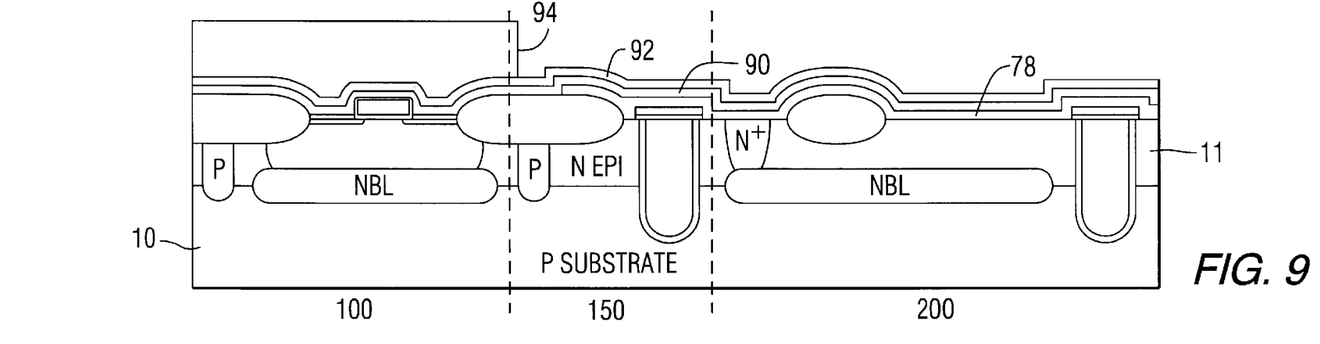

Having completed the formation of the CMOS transistors, the process protects the CMOS transistors while fabricating the NPN transistors. As a first step, a CMOS nitride protection layer 90, as shown in FIG. 9, is uniformly deposited over epitaxial layer 11. On top of the nitride protection layer, there is deposited a CMOS oxide protection layer 92. The combination of nitride and deposited oxide layers in two sequential steps saves future process steps. Since the two layers can be selectively etched with respect to each other, a substantial number of subsequent processing steps are saved by using the two layers as different etch stops.

Figure 10:
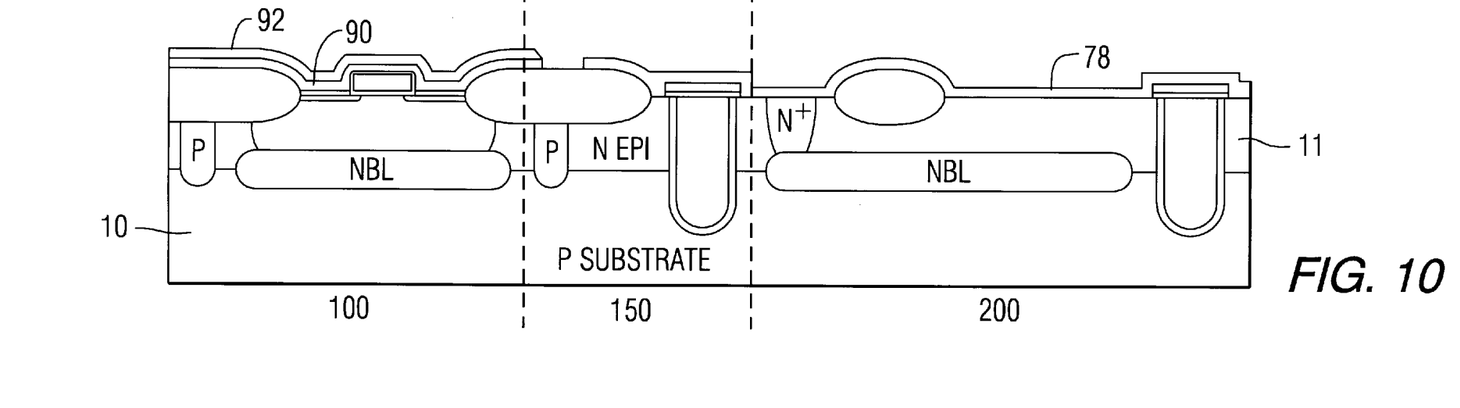

A photoresist layer 94 is deposited and patterned to cover the CMOS devices and at least part of the LOCOS region that extends from the transition region 150 into the CMOS region 100. The CMOS oxide protection layer 92 and nitride protection layer 90 are stripped from the exposed NPN region 200 using suitable wet etchings. As a result of sequential etching operations, the spacer oxide layer 78 is exposed as shown in FIG. 10.

Figure 11:
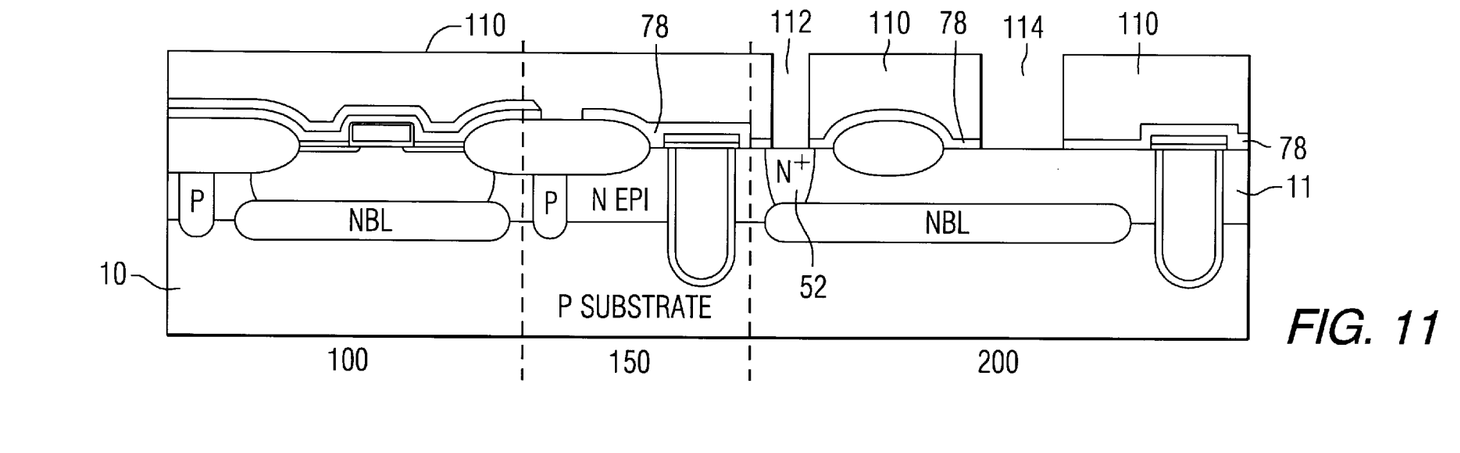

Turning to FIG. 11, a thermal oxide photoresist layer 110 is uniformly deposited over spacer oxide layer 78 and patterned to have openings 112 and 114 in the NPN section 200. With the photoresist 110 in place, the spacer oxide in exposed regions 112 and 114 is removed in order to expose the surface of the sinker diffusion 52 and the surface of the subsequent NPN transistor 200.

Figure 12:
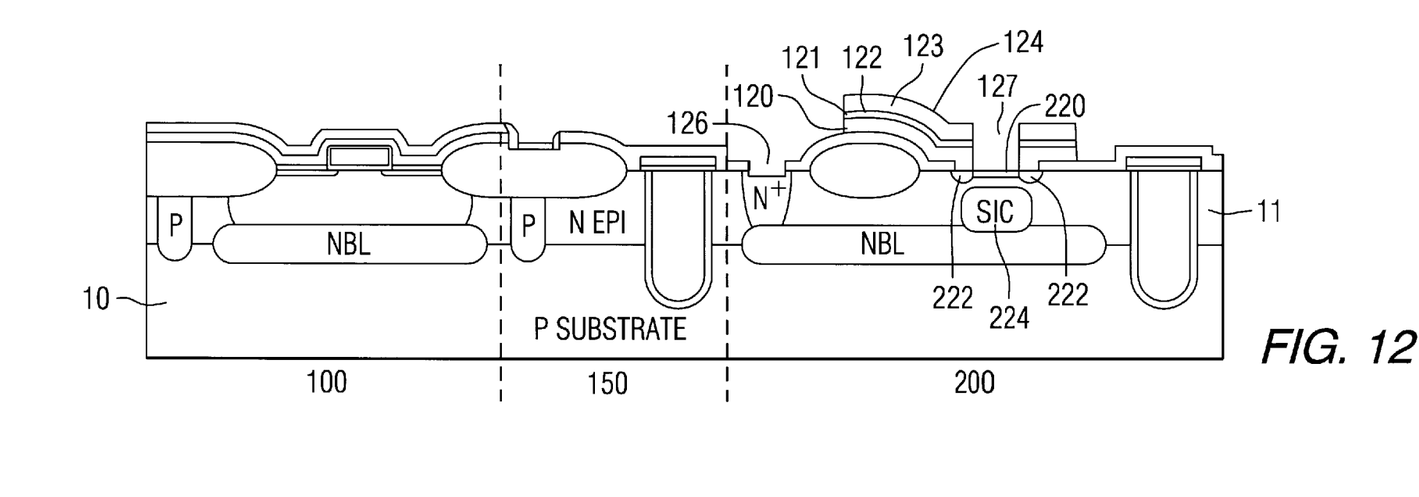
Figure 13:
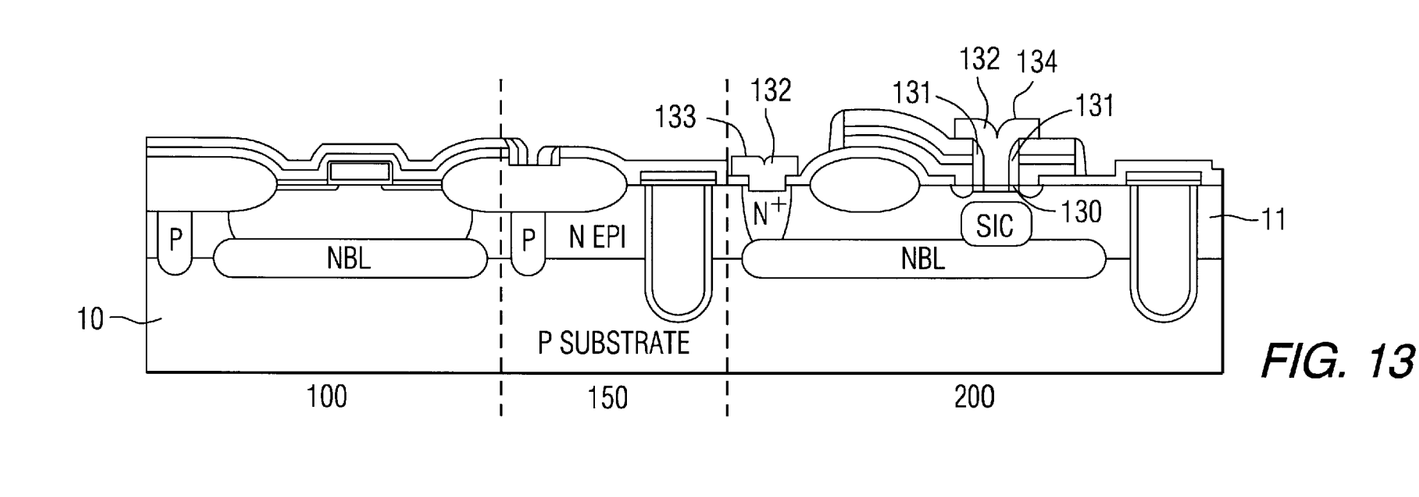

In the formation of the NPN transistor, the process forms the extrinsic base first, then the intrinsic base and finally, the emitter. The extrinsic base comprises a stack of layers that are deposited on the epitaxial layer 11. Turning to FIG. 12, these layers include a doped polysilicon layer 120, a tungsten silicide layer 121, a polysilicon cap layer 122, an inter-poly oxide layer 123 and a titanium nitride anti-reflective coating 124. The polysilicon layer 120, WSi layer 121 and polysilicon cap layer are deposited followed by an implant of boron that will form the extrinsic base. The stack is suitably patterned to form the emitter opening 127. As a result of thermal processing, dopants from layer 120 form the extrinsic base. A further boron implant through the emitter opening forms the intrinsic base. A SIC implant is also made through the intrinsic base and the emitter hole 127. The SIC implant contacts the N+ buried layer. The SIC implant is annealed, emitter surface is oxidized and a P-type implant forms the intrinsic base. Turning to FIG. 13, a layer of base spacer oxide 130 is deposited to mask the base region. A nitride spacer layer 131 is deposited and etched to open the emitter region. The spacer oxide is etched with suitable hydrofluoric acid. Thereafter, an emitter polysilicon layer 132 is deposited and patterned to form the emitter contact 134 and the collector contact 133. In a subsequent annealing operation, the N-type dopants from the emitter poly layer 132 diffuse into the surface of the epitaxial layer 11 in order to form the collector and the emitter of the NPN transistors 200.

Figure 14:
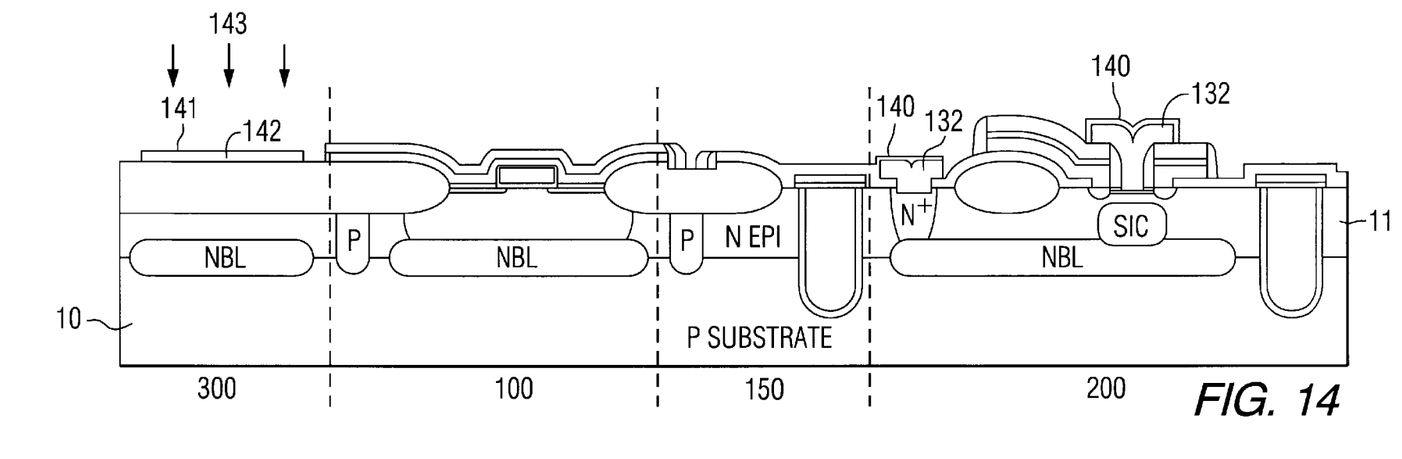
Figure 15:
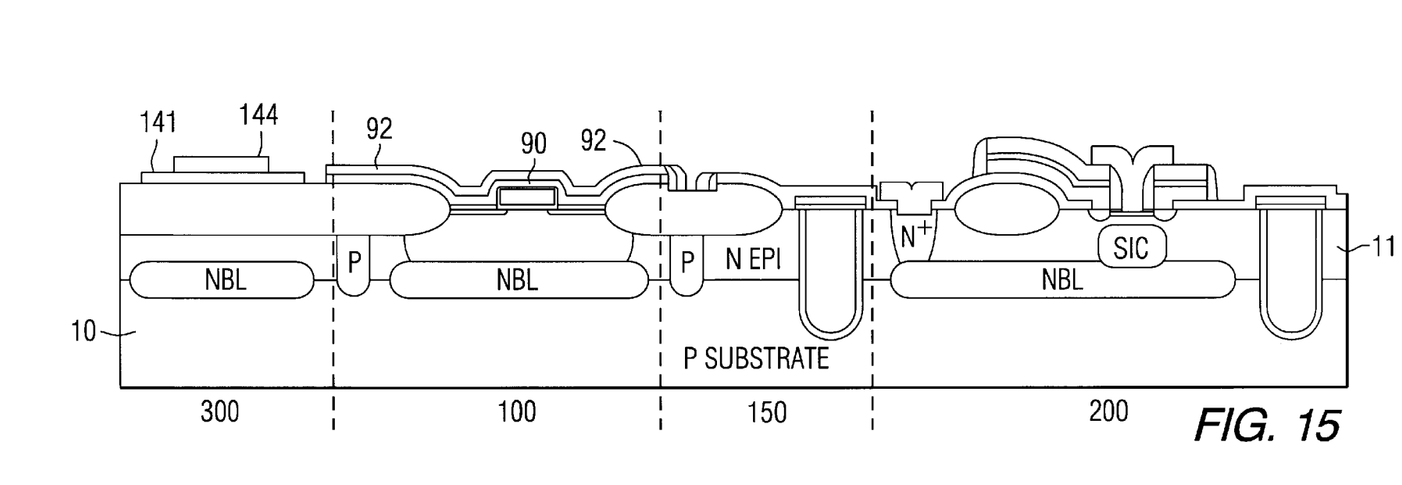

FIGS. 14 and 15 show the formation of the polysilicon resistor with a relatively low temperature coefficient of resistance (TCRL) resistor 141. As a first step, a protective oxide 140 is deposited over the epi layer 11. This layer protects any exposed emitter polysilicon layer 132 from etching when the TCRL regions are defined. A polysilicon layer 142 is deposited in the opening. Next, the polysilicon layer is implanted with a $BF_2$ implant 143. Finally, the TCRL 141 is covered with a photoresist and etched to its suitable size. As shown in FIG. 15, the TCRL layer 141 is then covered with a protective oxide 144. The oxide is suitably patterned and masked to protect the underlying portion of the TCRL 141.

In this process, we have been able to form a TCRL resistor 141 that has a resistance of 750 ohms per square and a temperature coefficient of resistance that is less than 100 parts per million (ppm). The resistor is formed using a non-selective $BF_2$ implant to dope the polysilicon layer. A 900° C. rapid thermal annealing (RTA) step activates the resistor implant and sets the final doping profiles for the bipolar and MOS devices 200, 100. It will be noted that a TCRL poly layer is deposited late in the process. As such, it is possible to deposit an amorphous silicon film and then adjust its resistivity by adding dopants. A non-selective $BF_2$ implant is used to dope the film. A mask is used to clear oxide from all contact areas and a 900° C. RTA step activates resistor implants to set the final doping. Resistor contacts are consequently silicided before final back end processing.

The TCRL resistor 141 separates the resistance from temperature sensitivity. Until now, it was assumed that high resistivity results in a greater temperature sensitivity. We attempted to separate those two characteristics by providing a relatively thin film with dopings adjusted to set the resistivity to 750 ohms per square. We found that as $BF_2$ implants approached a high level, there was an unanticipated increase in resistance observed. This, of course, is counterintuitive. This behavior was not observed when only boron was used to dope this film. One would expect that higher implant levels would decrease resistance, not increase it. We believe that the heavier ion ($BF_2$) in high doses creates a large amount of damage in the polysilicon film and that damage cannot be annealed at a relatively low temperature (900° C.) with short thermal annealing (RTA) to activate the implants. The implant damage creates additional trapping sites for carriers resulting in increased resistance at higher implant doses. It is believed that co-implantation of other ions could produce similar results making it possible to use the same high dose boron implant to produce even higher value resistors as well as emitters for PNP's or low resistivity extrinsic bases for NPN's or the sources and drains of MOS devices. In our preferred embodiment, the polysilicon layer 142 has a thickness of 70 nm and may be in a range of from 65 nm to 75 nm. The implant concentration of boron ions 142 is $1.3 \times 10^{16}$ and may be in a range from $9 \times 10^{15}$ to $1.5 \times 10^{16}$.

Early in the development, three film thicknesses with a medium boron dose were chosen for evaluation. As shown in table 1, the thinnest film came the closest to our objective of 750 $\Omega/\square$. However, the TCRs of all cells were above the goal of 100 ppm. A second set of tests left the film thickness at the thin setting and varied the implant dose over more than one decade with the expectation that the higher doses would result in lower sheet resistances and lower TCRs.

TABLE 1

TCR/RS vs. Poly Thickness

| Poly Th. | Rs | TCR |
|---|---|---|
| Thin | 650 | 228 |
| Med. | 532 | 238 |
| Thick | 431 | 292 |

Figure 20:
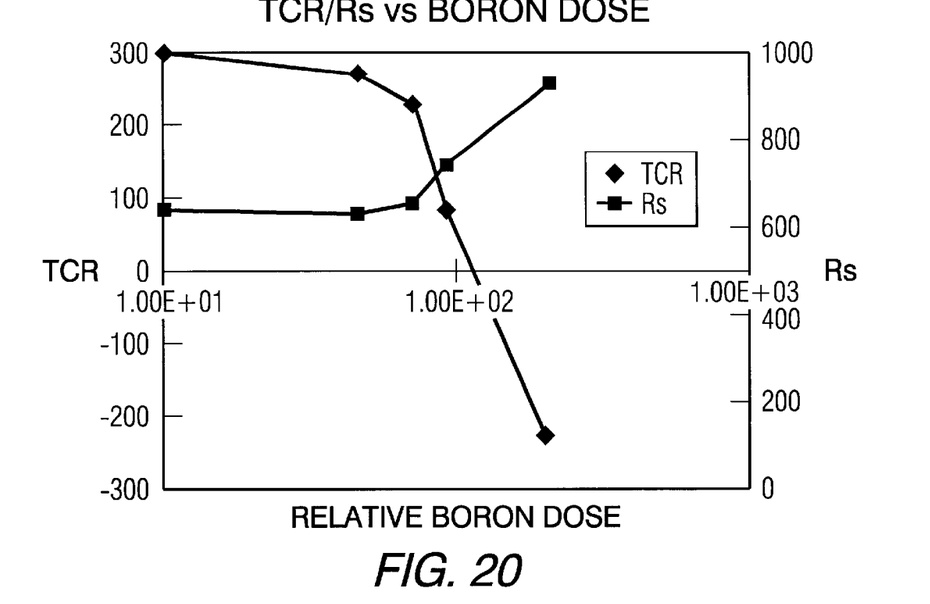
FIGS. 20–25 show experimental results for the TCRL.

At first, as indicated in FIG. 20, there is very little change in sheet resistance and TCR with increasing doses. However, as the implant levels start to approach the highest levels, an unanticipated increase in resistance is observed while the TCRs experience a sharp decline until they become negative at the highest dose.

Yamaguchi, et al. [Yamaguchi, et al., "*Process and Device Characterization for a 30-GHz ft Submicrometer Double Poly-Si Bipolar Technology Using BF2-Implanted Base with Rapid Thermal Process*", IEEE TED, August 1993] observed the same relationship between TCR and sheet resistance. In their study, TCRs of boron-doped P-type polysilicon resistors fabricated with a 150 nm amorphous layer approach zero at sheet resistances of 600–800 $\Omega/\square$. However, within the range of doses in their investigation, resistance declines with increasing boron doses.

In a parallel experiment aimed at lowering TCR, boron and boron plus another species ($BF_2$) were implanted into a medium thickness film. The implant energies were adjusted to compensate for the different ranges of the species. The results, once again, were quite unexpected: the average resistance of the boron by itself was 200 $\Omega/\square$ with a TCR of 445 ppm while the values for the $BF_2$ resistors were 525 and 221 respectively.

Based on these results, it is suspected that the heavier ion and the extremely high doses create a large amount of damage in the polysilicon film which cannot be annealed by the relatively short 900° C. RTA. This damage creates additional trapping sites for the carriers resulting in increased resistance at higher implant doses. Therefore, it is believed that co-implantation of other ions could produce similar results thus making it possible to use the same high dose boron implant to produce high value resistors as well as the emitters for PNPs or low resistivity extrinsic bases for NPNs or the sources and drains of MOS devices. Table 2 shows the effects of RTA temperature on sheet resistance and TCR as a function of implant dose. Once again, the higher sheet resistances obtained with the lower temperature yield reduced TCRs except at the lower dose where a resistance of 763 results in a TCR of 168.

This lends support to the theory that damage is a major part of the previously observed TCR behavior. The lower RTA temperature leads to suppressed carrier activation and higher sheets. Concurrently, there is less annealing of the implant damage. However, at the low dose, there is insufficient implant damage to degrade carrier mobility to the point where it becomes less sensitive to the temperature variations.

TABLE 2

TCR/RS vs. RTA Temp

| Dose | Rs | TCR | RTA |
|---|---|---|---|
| Low | 637 | 293 | 900 C. |
| Low | 763 | 168 | 800 C. |
| Med. | 628 | 271 | 900 C. |
| Med. | 849 | 76 | 800 C. |
| High | 726 | 90 | 900 C. |
| High | 832 | 22 | 800 C. |

Characterization Results

Figure 21:
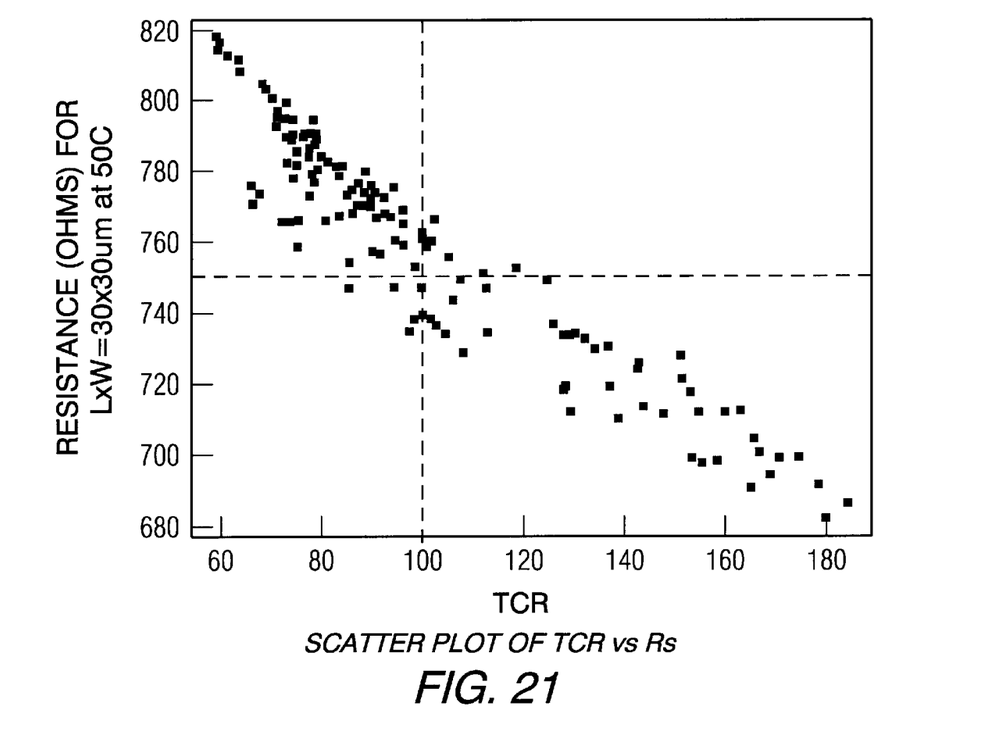

FIG. 21 is a scatter plot of a 30×30 micron resistor showing the relationship of TCR to sheet resistance at 50° C. was chosen as the lowest measurement point. The TCR is calculated by fitting a line to values measured from 50–125° C. at 25 intervals. The dashed lines denote the objectives that were set for this development project.

Figure 22:
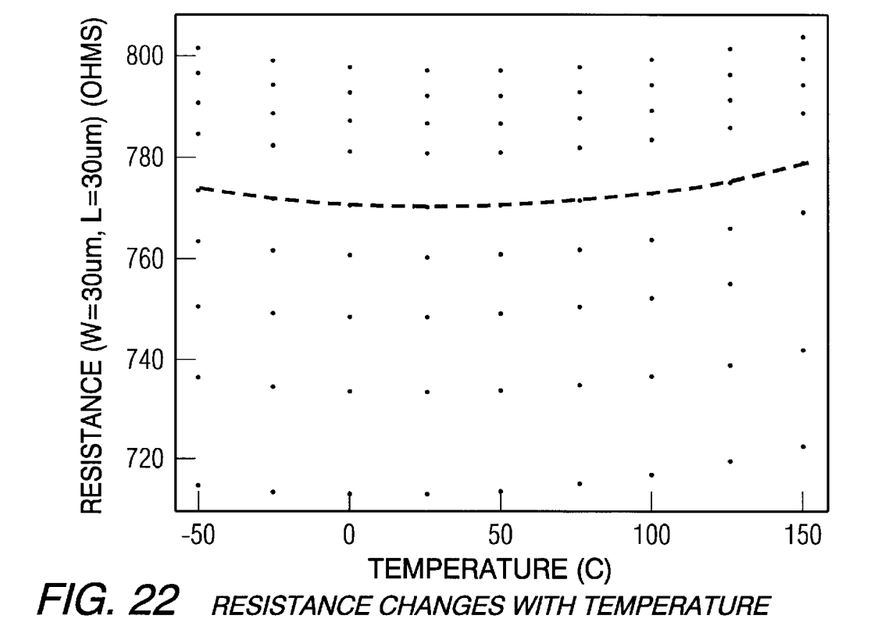
Figure 23:
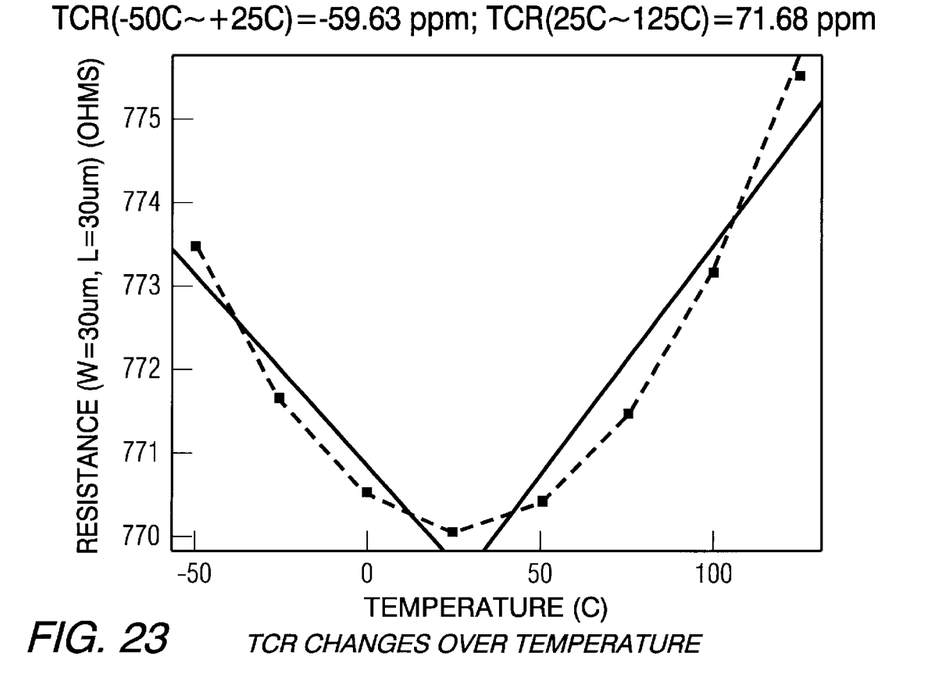

Parts from two different runs were packaged and measured from −50 to 150° C. FIG. 22 shows average changes in sheet resistance for nine parts measured over this temperature range while FIG. 23 is a plot of the calculated TCRs for this set of measurements. The solid line represents a linear fit while the dashed line is a polynomial fit. The upward "hook" observed at lower temperature is typical to that of diffused resistors.

Figure 24:
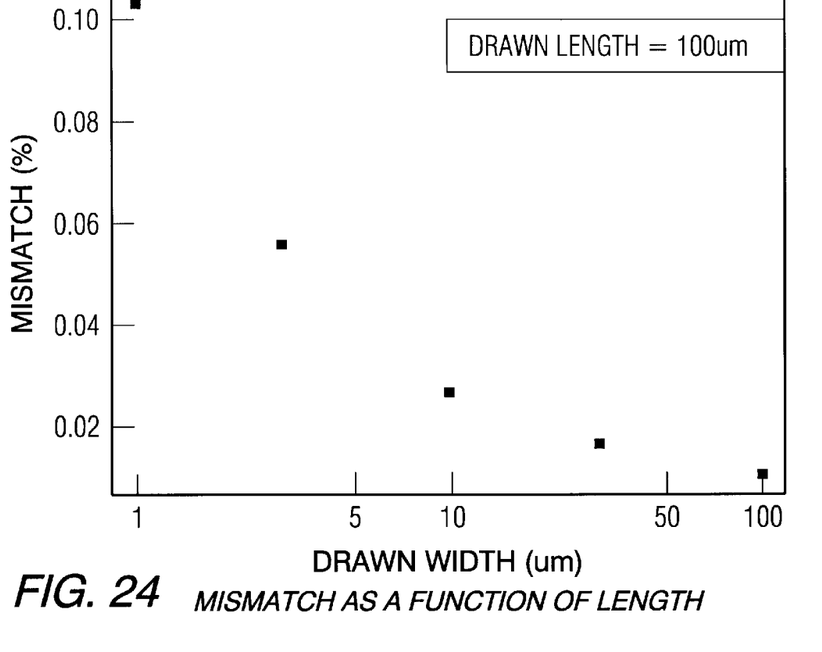
Figure 25:
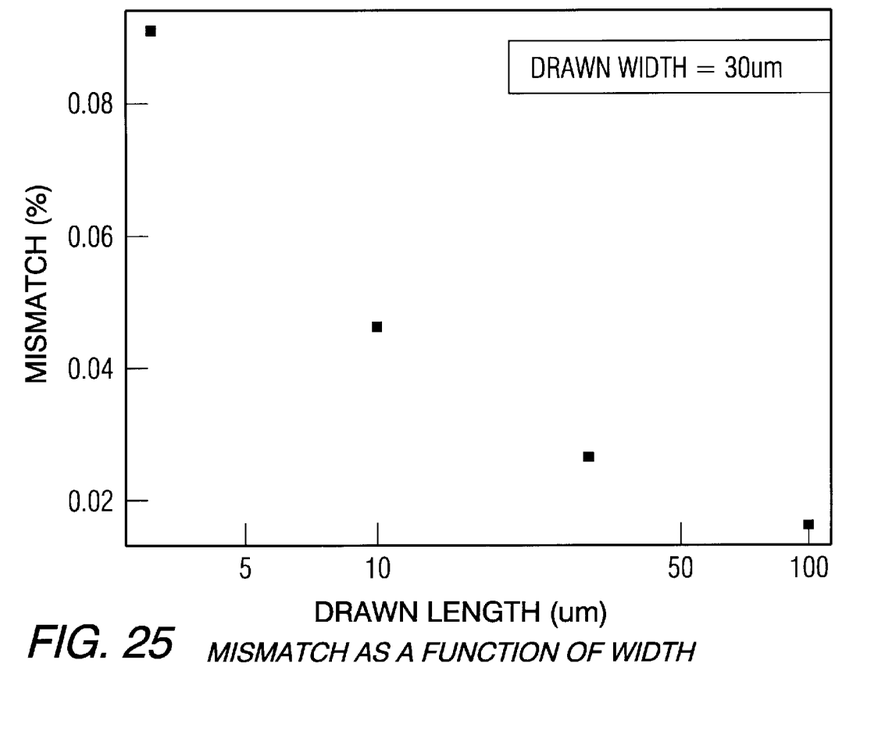

Since matching is of particular interest to analog, and mixed signal designers, FIG. 24 shows the percent mismatch as a function of length for a fixed width resistor and FIG. 25 represents the same parameter as a function of width with a fixed length. The data, as expected, show improved matching with increasing dimensions.

The feasibility of fabricating a high value polysilicon resistor with low TCR has been demonstrated. The investigation has uncovered a relationship between ion species, sheet resistance and TCR which can result in reduced process complexity. Since 800° C. RTA is a benign temperature for present bipolar processes, it is possible if desired to de-couple the resistor activation step from the RTA used to set the device electrical parameters.

Figure 16:
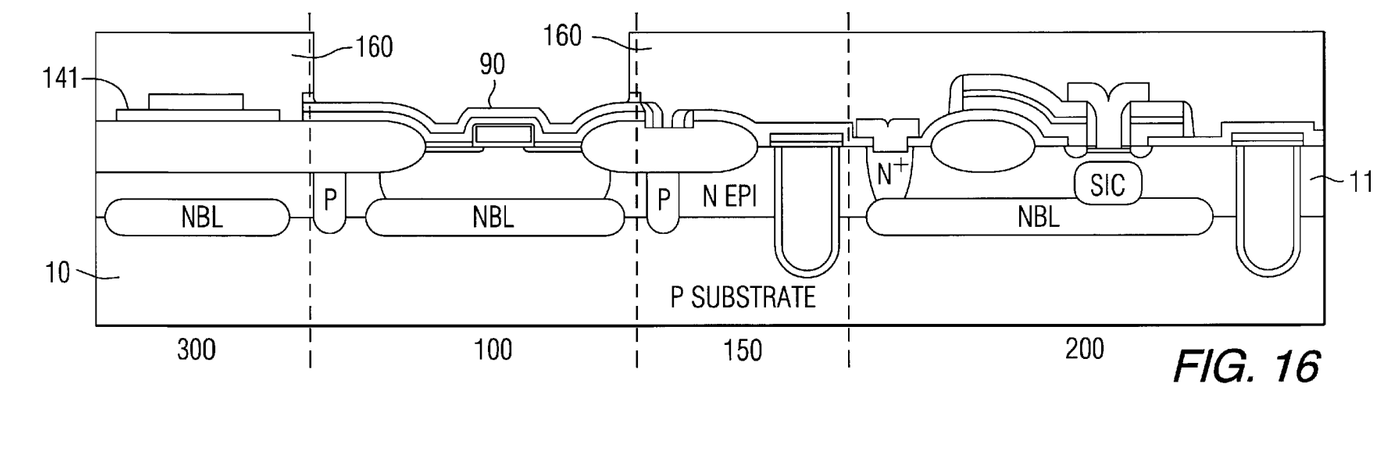
Figure 17:
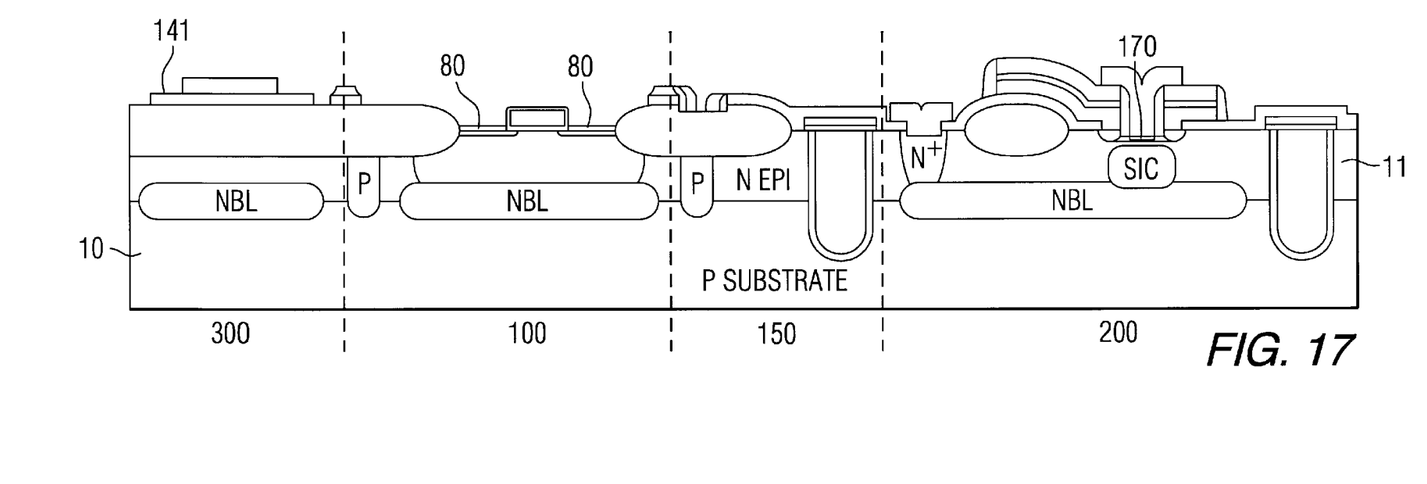
Figure 18:
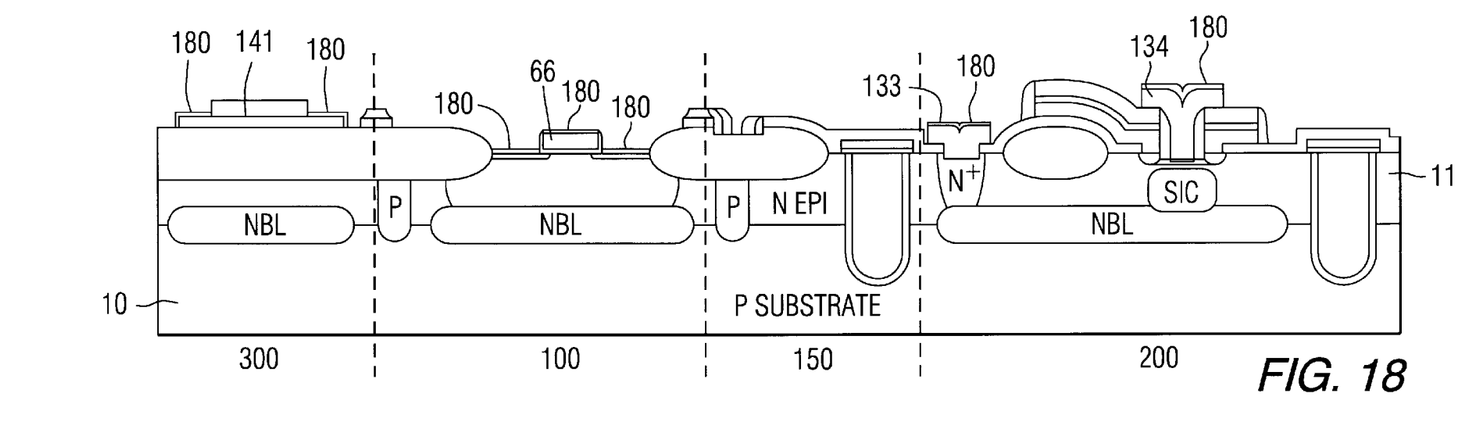

Turning next to FIG. 16, the TCRL resistor 141 and the NPN transistor regions 200 are protected with a layer of photoresist 160. The photoresist is patterned to open a region above the CMOS devices 100. Next, the protective oxide 92 (FIG. 19) is removed. The photoresist layer 160 is removed, followed by removal of the nitride protect layer 94. At this time, the emitter and the resistor 140 are subjected to an RTA step. The step is carried out at approximately 900° C. for 0.5 minutes.

Figure 19:
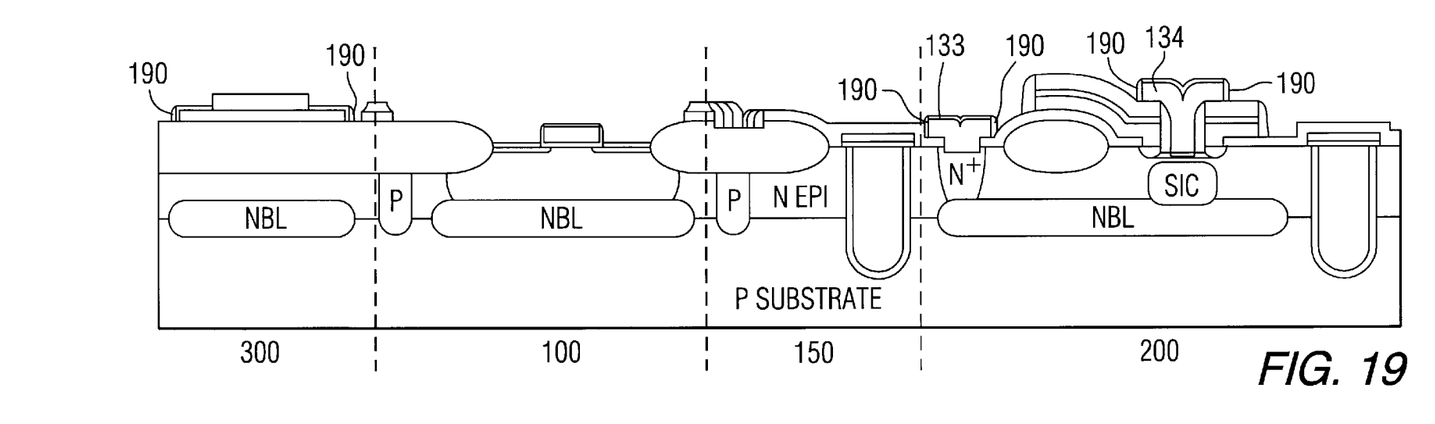

The screen oxide layer 180 is removed and the exposed polysilicon regions of the resistor 141, the gate 66 and the emitter and collector contacts 131, 133 are silicided with platinum 180 to form a platinum suicide layer on the exposed polysilicon. As shown in FIG. 19, a sidewall spacer oxide 190 is applied to the sidewalls of the emitter 131 and the collector contact 133. The rest of the spacer oxide is etched and removed. Thereafter, the substrate is subjected to suitable metalization layers, including the formation of three metal layers separated from each other by suitable insulating layers and separate layers being selectively interconnected, one to the other, by the formation of vias that are filled with conductive material. After metalization the entire device is covered with a passivation layer, typically silicon nitride, and a substrate including the integrated circuits and devices made thereon are then further processed for testing and assembly.

Having thus disclosed preferred embodiments of the invention, those skilled in the art will appreciate that further modifications, changes, additions and deletions may be made to that embodiment without departing from the spirit and scope of the appended claims.

What is claimed is:

1. In an integrated circuit, a precision polysilicon resistor comprising:

an insulation layer covering a substrate; and a layer of polysilicon having substantial unannealed implant damage, said layer of polysilicon being disposed on said insulation layer and having a relatively high dopant concentration, said layer of polysilicon having a thickness ranging from 65 nm to 75 nm and having a sheet resistance ranging from 725 ohms/square and 850 ohms/square.

2. The integrated circuit of claim 1, wherein said layer of polysilicon has a temperature coefficient of resistance ranging from 20 to 100 parts per million.

* * * * *